United States Patent
Ngo et al.

(10) Patent No.: US 6,221,793 B1
(45) Date of Patent: Apr. 24, 2001

(54) PROCESS FOR FORMING PECVD UNDOPED OXIDE WITH A SUPER LOW DEPOSITION RATE ON A SINGLE STATE DEPOSITION

(75) Inventors: Minh Van Ngo, Fremont, CA (US); Hartmut Ruelke, Dresden-Wilschdorf (DE); Robert A. Huertas, Hollister, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/517,092

(22) Filed: Mar. 1, 2000

(51) Int. Cl.[7] ............... H01L 21/31; H01L 21/469
(52) U.S. Cl. .......................... 438/788; 438/787
(58) Field of Search ..................... 438/758, 787, 438/788; 427/578, 579, 588

(56) References Cited

U.S. PATENT DOCUMENTS 5,736,423 * 4/1998 Ngo ............................. 437/238
5,904,529 * 5/1999 Gardner et al. ............... 438/286
6,077,764 * 6/2000 Sugiarto et al. ............... 438/597

* cited by examiner

*Primary Examiner*—John F. Niebling
*Assistant Examiner*—Alexander G. Ghyka

(57) ABSTRACT

A process for super low deposition rate plasma enhanced chemical vapor deposition (PECVD) of undoped oxide on a single station deposition is provided. A very thin PECVD oxide layer used, for instance, as an oxide liner between a polysilicon gate and a nitride spacer, may be produced in a PECVD chamber with a reduced flow rate of silane, nitrous oxide and molecular nitrogen. The deposition rate may be lowered to 20 angstroms/minute, for example, with this long deposition time providing a better process control. At the same time, the film is dense, silicon rich, highly compressive, provides excellent step coverage and acceptable thickness uniformity.

19 Claims, 2 Drawing Sheets

PROCESS FOR FORMING PECVD UNDOPED OXIDE WITH A SUPER LOW DEPOSITION RATE ON A SINGLE STATE DEPOSITION

FIELD OF THE INVENTION

The present invention relates to the field of semiconductor processing, and in particular, to the formation of a very thin oxide layer on a semiconductor wafer.

BACKGROUND OF THE INVENTION

Various integrated circuits utilize structures formed with a thin layer of silicon dioxide ($SiO_2$) for various purposes. For example, a thin layer of silicon dioxide is used as a protection structure for on-chip resistors. As integrated circuit technologies become smaller, it is advantageous for all structures to become smaller, including thin silicon dioxide layers.

Suitably thin silicon dioxide layers can be formed using a conventional method of thermal oxide deposition. However, the high thermal budget associated with thermal oxide consumes silicon and drives source/drain (S/D) implantation further so that the source/drain implant is not easily controlled.

An advantageous alternative to thermal oxide deposition of thin silicon dioxide layers is deposition using the plasma-enhanced chemical vapor deposition (PECVD) technique. However, one of the concerns with conventional PECVD methods is that they do not allow deposition of layers less than about 1000 angstroms.

The process for producing a very thin (less than 350 angstroms) layer of silicon dioxide by PECVD was described in U.S. Pat. No. 5,736,423. In this reference, the time duration of pre-coating and soak time steps of the PECVD process were substantially increased, and the flow of silane ($SiH_4$) was substantially reduced, as well as the applied pressure and high-frequency power. Deposition rates were lowered from the previously conventional process of 5500 angstroms per minute to 1700 angstroms per minute.

Although U.S. Pat. No. 5,736,423 provides a process that reduces the deposition rate to provide a more controllable process, further improvements in the deposition rate for a better process control are desirable. At the same time, with a super low deposition rate, the film still needs to be dense, silicon rich, highly compressive, with excellent step coverage and acceptable thickness uniformity.

SUMMARY OF THE INVENTION

There is a need for a method of providing a super low deposition rate, very thin deposition layer of PECVD oxide, with excellent step coverage.

These and other needs are met by embodiments of the present invention which provide a method of depositing oxide on a wafer in a PECVD reactor. The method includes the steps of applying reactant gases to the wafer, including: silane ($SiH_4$) at a flow rate in a range from 10 to 60 sccm; nitrous oxide ($N_2O$) at a flow rate in a range from 200 to 1000 sccm; and nitrogen ($N_2$) at a flow rate in a range from 4000 to 8000 sccm. Reactor pressure is maintained between 3 to 7 torr, and RF power is applied between 100 and 170 watts.

The earlier stated needs are also met by another embodiment of the present invention which provides a method of forming a semiconductor device arrangement comprising forming a gate having sidewalls and depositing on the gate sidewalls by PECVD a layer of oxide less than 200 angstroms thick at a deposition rate less than 20 angstroms per second. Nitride spacers are then formed on the oxide layer. Forming the undoped oxide liner with a super low deposition rate as provided in the present invention, when used together with the nitride spacer, may improve P channel Idsat:Idoff by a significant amount when compared to that of LPCVD (low pressure chemical vapor deposition) processes.

The earlier stated needs are also met by another embodiment of the present invention that provides a semiconductor device arrangement comprising a gate having sidewalls, an oxide liner on the gate sidewalls, and nitride spacers on the oxide liner. The oxide liner is a super low deposition rate PECVD oxide layer having a deposited thickness of less than 200 angstroms. In certain embodiments, the super low deposition rate PECVD oxide layer has a refractive index greater than or equal to 1.48, a thickness non-uniformity of 1.1% or less, and step coverage of 90% or greater.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems associated with forming a very thin oxide layer, e.g. less than 200 angstroms, for front-end of line (FEOL) of microprocessor device processing. Previous processes, used with multi-layer deposition stations, reduce the deposition rate of the silicon dioxide to provide better process control. The present invention provides a super low deposition rate, such as a 20 angstroms/second deposition rate, but still provides a deposition layer with excellent step coverage. This process can be performed in a single deposition station.

Figure 1A:
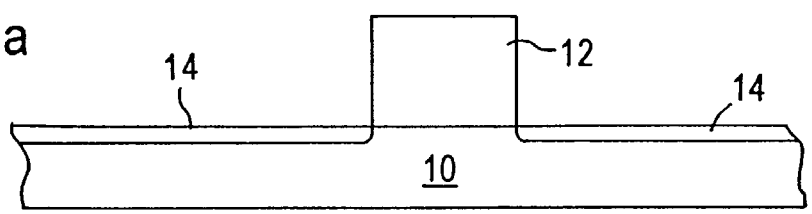
FIGS. 1A, 1B, 1C and 1D depict the formation of a semiconductor device in accordance with the methods of the present invention and having a very thin oxide layer deposited by a super low deposition rate PECVD.

FIG. 1A depicts a cross section of a semiconductor wafer during one stage of processing, in order to illustrate a possible use of a deposited oxide layer in accordance with the embodiments of the present invention. However, other uses of very thin deposited layers, such as a protection structure for on-chip resistors, may be provided by the present invention.

The structure of FIG. 1A shows a substrate 10 on which a polysilicon gate 12 has been previously formed. Source/drain extensions 14 are provided by introducing dopants in a conventional manner into the substrate 10.

Figure 1B:
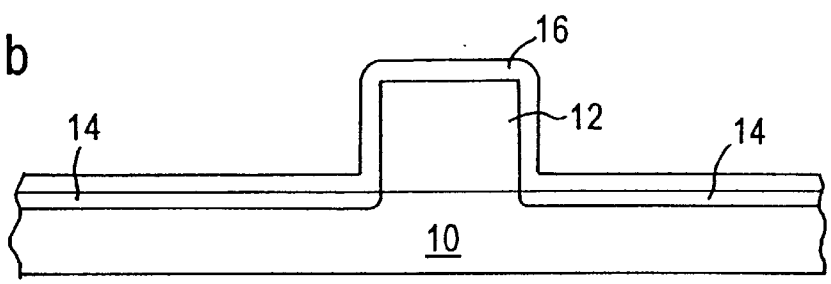
Figure 1C:
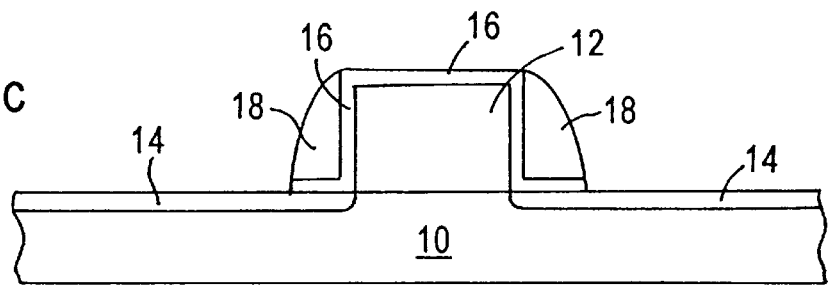

FIG. 1B depicts the semiconductor wafer following the deposition of a very thin deposition layer 16. The layer 16 is an oxide layer in the present invention, such as a silicon dioxide ($SiO_2$) layer. In preferred embodiments, the oxide layer 16 is less than 200 angstroms and may be, for example, 50 angstroms in thickness. Prior to discussing the method of forming the oxide layer 16 with the desired thickness and desirable properties, the remainder of the semiconductor device formation process will be described with respect to FIGS. 1C and 1D.

Following the formation of the oxide layer 16, nitride spacers 18 are formed on the sidewalls of the polysilicon gate 12. However, the very thin oxide layer 16 remains between the sidewalls of the polysilicon gate 12 and the nitride spacers 18 as an oxide liner.

Figure 1D:
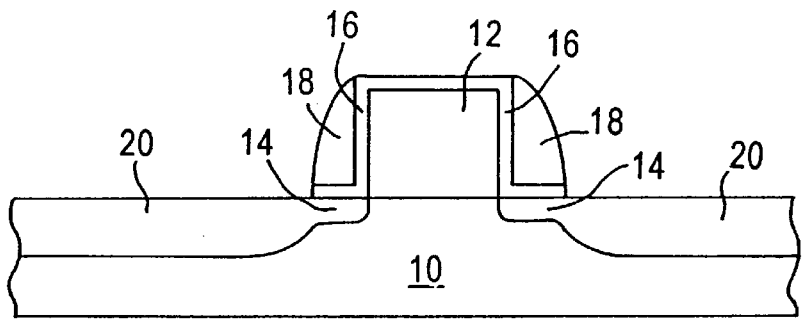

FIG. 1D depicts the semiconductor device after dopant implantation and annealing to form the source/drains 20.

The combination of the super low deposition rate oxide liner formed by the oxide layer 16 with the nitride spacer 18 has been found to improve the P channel Idsat:Idoff in comparison to that of semiconductor devices formed by conventional LPCVD methods.

Figure 2:
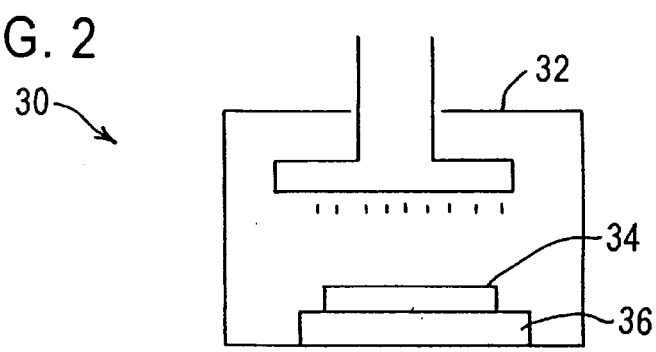
FIG. 2 is a schematic depiction of a PECVD chamber for carrying out the super low deposition rate deposition of oxide on a wafer in accordance with the embodiments of the present invention.

A schematic depiction of a single deposition station PECVD machine, with a dual chamber, is depicted in FIG. 2. An exemplary machine for use with the method of the present invention is an Applied Materials Producer (™) PECVD machine with a dual chamber that provides higher throughput and lower cost of ownership. The PECVD reactor 30 includes a chamber 32 holding a wafer 34. The wafer 34 is placed into the chamber 32 and heated on a heater block 36 before reactant gasses, power and pressure are applied to the chamber 32.

In the deposition process, performed with a super low deposition rate, the reactants in the present invention include saline ($SiH_4$), nitrous oxide ($N_2O$) and molecular nitrogen ($N_2$) at a selected pressure and RF power. The deposition parameters are substantially different from the deposition parameters for a conventional PECVD technique. In the present invention, the silane is applied at a flow rate in a range of 10 to 60 sccm, and preferably at about 35 sccm. Nitrous oxide is applied to the wafer at a flow rate in a range from 200 to 1000 sccm, and preferably at about 650 sccm. The molecular nitrogen is applied to the wafer at a flow rate in a range from 4000 to 8000 sccm, and preferably at 6000 sccm.

In preferred embodiments of the invention, the reactor pressure is maintained between 3 and 7 torr, with a preferable reactor pressure of 5.5 torr. The RF power applied is between 100 and 170 watts, with a preferred RF power of 135 watts. The spacing is in a range of 300 to 500 mils, with a preferred spacing of 400 mils.

When the preferred deposition parameters are employed, the process results in a deposition rate of the undoped oxide of 20 angstroms/sec., a refractor index of (RI) equal to 1.48, a thickness non-uniformity of 1.1% and a step coverage of 90%. These represent significant improvements over results of prior deposition techniques. The very long deposition time provided by the super low deposition rate produces a better process control. The film produced is dense, silicon rich, highly compressive with excellent step coverage and acceptable thickness uniformity.

Figure 3:
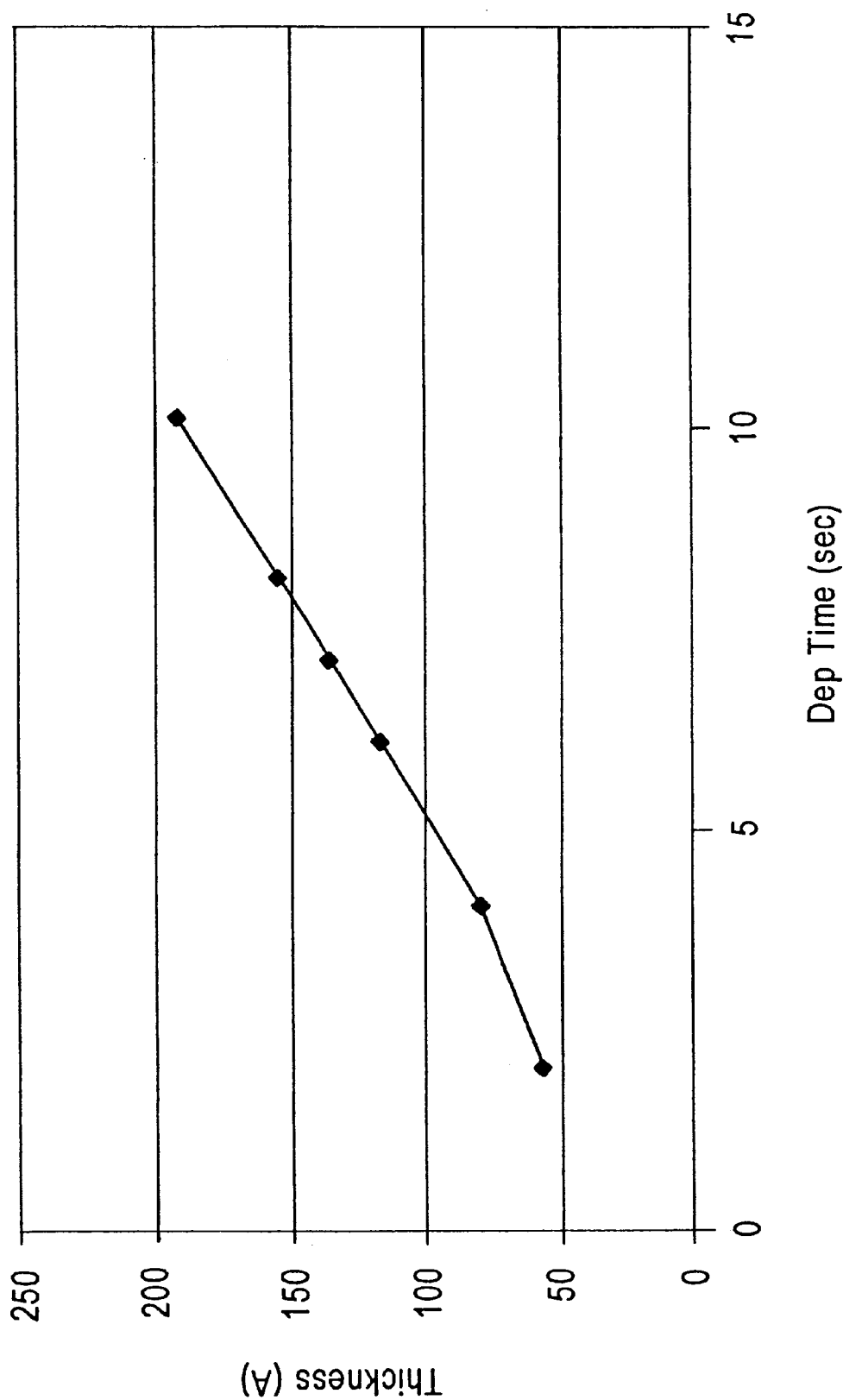
FIG. 3 is a graph depicting the growth and thickness of a layer plotted against the deposition time in accordance with methods of the present invention.

FIG. 3 depicts a chart of the thickness of the oxide layer 16 as a function of deposition time. This chart is exemplary only, however, as changes in the parameters in accordance with the present invention will alter the deposition time. The process parameters should be kept within the described ranges in order to not vary the deposition rate excessively.

As described, the use of the super low deposition rate undoped oxide liner, together with a nitride spacer as shown in FIG. 1D, improves the P channel Idsat:Idoff when compared to that of conventional LPCVD processes. The present invention finds particular applicability in a single deposition station PECVD machine, but the invention is not limited to use in such machines, and can also be used in multi-layer station PECVD machines.

By providing such a super low deposition rate, a very thin deposition layer, such as 50 angstroms of PECVD silicon dioxide, may be produced with an acceptable variation in the thickness of the layer. The method of the invention overcomes the high thermal budget associated with conventional methods of thermal oxide deposition, and the thickness constraints of conventional PECVD methods that do not allow deposition of layers less than about 1000 angstroms. It also further improves on the very thin deposition process of U.S. Pat. No. 5,736,423 by further lowering the deposition rate.

Although the present invention has been described and illustrated in detail, it is to be clearly understood that the same by way of illustration and example only and is not to be taken by way of limitation, the scope of the present invention being limited only by the terms of the appended claims.

What is claimed is:

1. A method of depositing oxide on a wafer in a PECVD reactor comprising the steps of:

applying reactant gases to the wafer including: silane ($SiH_4$) at a flow rate in a range of 10 to 60 sccm; nitrous oxide ($NO_2$) at a flow rate in a range from 200 to 1000 sccm, and nitrogen ($N_2$) at a flow rate in a range from 4000 to 8000 sccm;

maintaining reactor pressure of between 3 to 7 torr; and applying RF power of between 100 and 170 watts.

2. The method of claim 1, wherein spacing is in a range of 300 to 500 mils.

3. The method of claim 1, wherein the oxide is undoped silicon dioxide ($SiO_2$).

4. The method of claim 1, wherein the oxide is deposited on a polysilicon gate.

5. The method of claim 1, wherein the deposition is a single station deposition.

6. The method of claim 1, further comprising depositing the oxide up to a thickness of less than 200 angstroms.

7. The method of claim 1, wherein the deposition rate is less than 20 angstroms/sec.

8. The method of claim 1, wherein silicon is applied to the wafer at a flow rate of about 35 sccm, nitrous oxide at about 650 sccm, nitrogen at about 6000 sccm; RF power is applied at about 135 watts, pressure is maintained at about 5.5 torr, and spacing is about 400 mils.

9. The method of claim 8, wherein the deposition rate is about 20 angstroms/sec.

10. A method of forming a semiconductor device arrangement comprising:

forming a gate having sidewalls;

depositing on the gate sidewalls by PECVD a layer of oxide less than 200 angstroms thick at a deposition rate about 20 or less angstroms/sec.; and forming nitride spacers on the oxide layer.

11. The method of claim 10, wherein the step of depositing a layer of oxide includes locating a wafer in a PECVD reactor and applying reactant gases to the wafer including: silane ($SiH_4$) at a flow rate in a range from 10 to 60 sccm, nitrous oxide ($NO_2$) at a flow rate in a range from 200 to 1000 sccm, and nitrogen ($N_2$) at a flow rate in a range from 4000 to 8000 sccm.

12. The method of claim 11, wherein the step of depositing a layer of oxide further includes maintaining reactor chamber pressure of between 3 to 7 torr.

13. The method of claim 12, wherein the step of depositing a layer of oxide further includes applying RF power of between 100 and 170 watts.

14. The method of claim 10, wherein the step of depositing a layer of oxide includes locating a wafer in a PECVD reactor and applying reactant gases to the wafer including silane ($SiH_4$) at a flow rate of about 35 sccm, nitrous oxide ($NO_2$) at a flow rate of about 650 sccm, and nitrogen ($N_2$) at a flow rate of about 6000 sccm.

15. The method of claim 14, wherein the step of depositing a layer of oxide further includes maintaining reactor chamber pressure of about 5.5 torr.

16. The method of claim 15, wherein the step of depositing a layer of oxide further includes applying RF power of about 135 watts.

17. A method of depositing an oxide layer on a semiconductor wafer by a plasma enhanced chemical vapor deposition process, comprising the steps of:

placing a semiconductor wafer in a PECVD chamber;

depositing the oxide on the semiconductor wafer at a deposition rate about 20 or less angstroms/second.

18. The method of claim 17, wherein the step of depositing the oxide includes applying reactant gases to the wafer including: silane ($SiH_4$) at a flow rate in a range from 10 to 60 sccm, nitrous oxide ($NO_2$) at a flow rate in a range from 200 to 1000 sccm, and nitrogen ($N_2$) at a flow rate in a range from 4000 to 8000 sccm.

19. The method of claim 18, wherein the step of depositing the oxide layer further includes: maintaining reactor chamber pressure between 3 to 7 torr, applying RF power between 100 and 170 watts, and maintaining a spacing between 300 and 500 mils.

* * * * *